US012562742B2

(12) United States Patent
Soliman et al.

(10) Patent No.: US 12,562,742 B2
(45) Date of Patent: Feb. 24, 2026

(54) METHOD FOR PROCESSING INPUT VARIABLES BY MEANS OF A PROCESSING DEVICE HAVING AT LEAST ONE TRANSISTOR, DEVICE FOR EXECUTING THE METHOD, COMPUTING DEVICE AND USE

(71) Applicant: Robert Bosch GmbH, Stuttgart (DE)

(72) Inventors: Taha Soliman, Renningen (DE); Tobias Kirchner, Ludwigsburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 172 days.

(21) Appl. No.: 18/600,281

(22) Filed: Mar. 8, 2024

(65) Prior Publication Data

US 2024/0313779 A1      Sep. 19, 2024

(30) Foreign Application Priority Data

Mar. 17, 2023   (DE) ..................... 10 2023 106 814.8

(51) Int. Cl.
*H03K 19/0948* (2006.01)
*G11C 13/00* (2006.01)
(52) U.S. Cl.
CPC ..... *H03K 19/0948* (2013.01); *G11C 13/0002* (2013.01)

(58) Field of Classification Search
CPC ............ H03K 19/0948; G11C 13/0002; G11C 11/54; G11C 13/0007; G11C 13/004; G06F 7/523; G06F 17/16
See application file for complete search history.

(56) References Cited

U.S. PATENT DOCUMENTS

| | | | |
|---|---|---|---|
| 9,548,741 B1 * | 1/2017 | Kvatinsky | .......... H03K 19/1776 |
| 9,691,479 B1 | 6/2017 | Merced Grafals et al. | |
| 2022/0028444 A1 | 1/2022 | Papageorgiou et al. | |

FOREIGN PATENT DOCUMENTS

DE        102020210737 A1      3/2022

* cited by examiner

*Primary Examiner* — Xiaochun L Chen
(74) *Attorney, Agent, or Firm* — NORTON ROSE FULBRIGHT US LLP

(57) ABSTRACT

A method for processing input variables by means of a processing device having least a first transistor. The method including: providing the first transistor and a first memristive element, which characterizes a first input variable associated with the first transistor, wherein a charging current of a capacitance associated with a control electrode of the first transistor can be influenced using the first memristive element; applying to the control electrode of the first transistor a first output variable which characterizes a second input variable associated with the first transistor; ascertaining a first output variable which characterizes at least one product of the first input variable and of the second input variable, based on a first variable characterizing a time profile of a current through a load path of the first transistor.

23 Claims, 9 Drawing Sheets

210

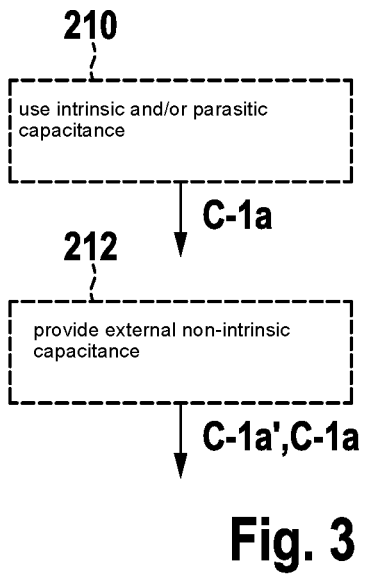

use intrinsic and/or parasitic capacitance

↓ C-1a

212 provide external non-intrinsic capacitance

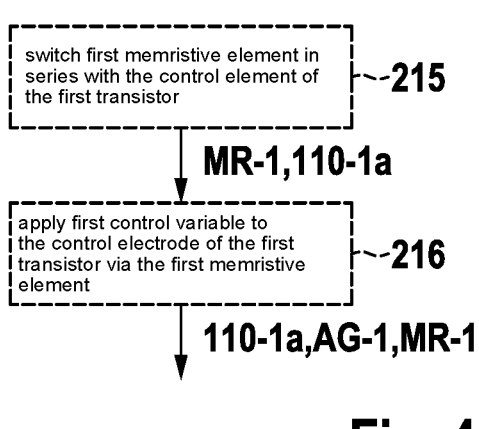

switch first memristive element in series with the control element of the first transistor ├─215

↓ MR-1,110-1a apply first control variable to the control electrode of the first transistor via the first memristive element ├─216

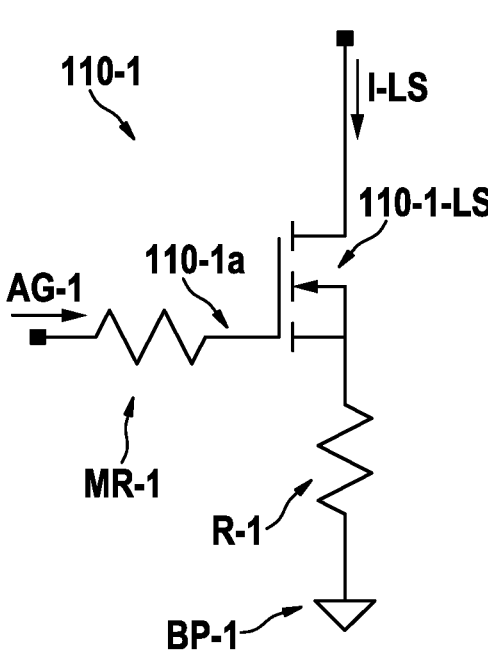

110-1

I-LS

110-1-LS

110-1a

AG-1

MR-1

R-1

BP-1

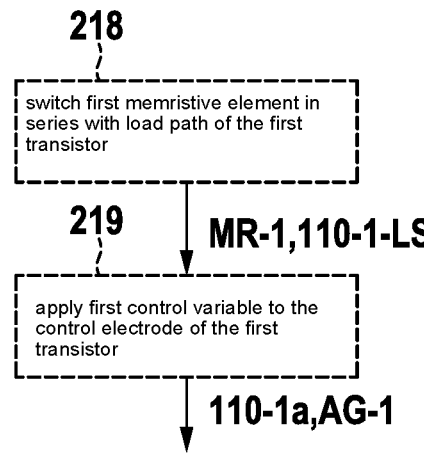

switch first memristive element in series with load path of the first transistor

219 ↓ MR-1,110-1-LS apply first control variable to the control electrode of the first transistor

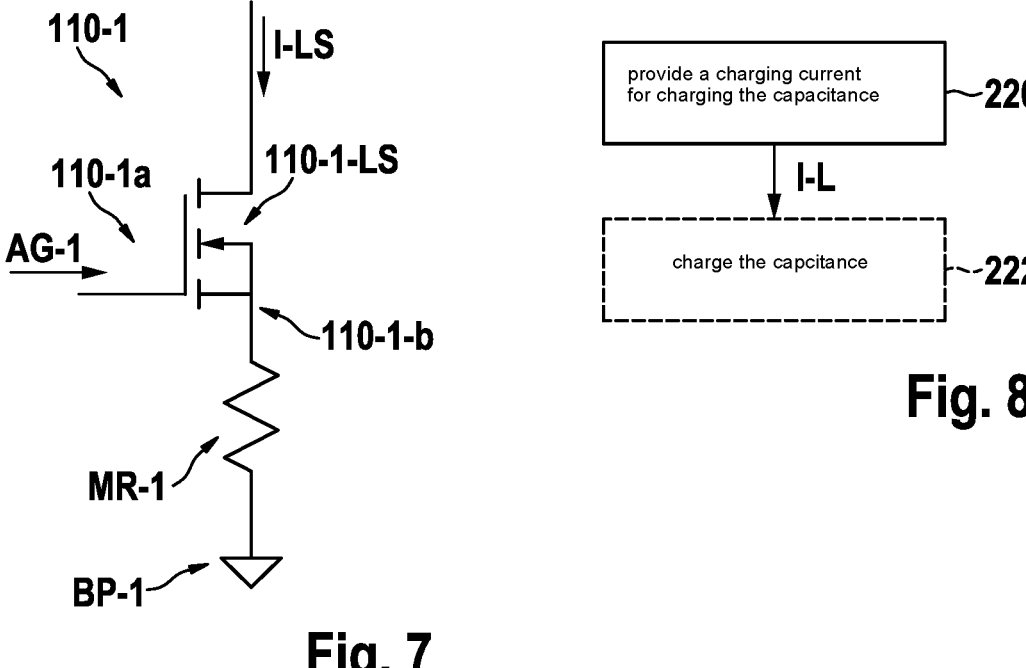
Fig. 7
provide a charging current
for charging the capacitance          ~220
I-L
charge the capcitance          ~222
Fig. 8
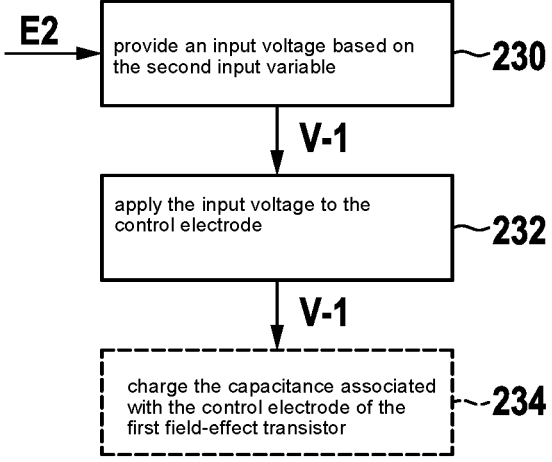
E2 → provide an input voltage based on
the second input variable          ~230
V-1
apply the input voltage to the
control electrode          ~232
V-1
charge the capacitance associated
with the control electrode of the
first field-effect transistor          ~234
Fig. 9

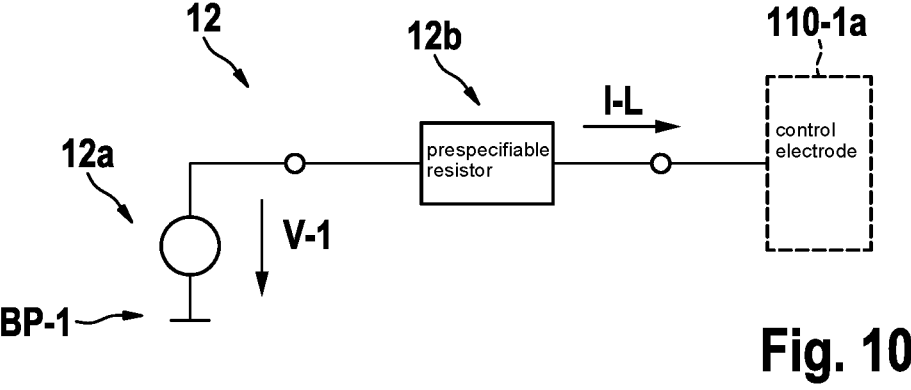
Fig. 10
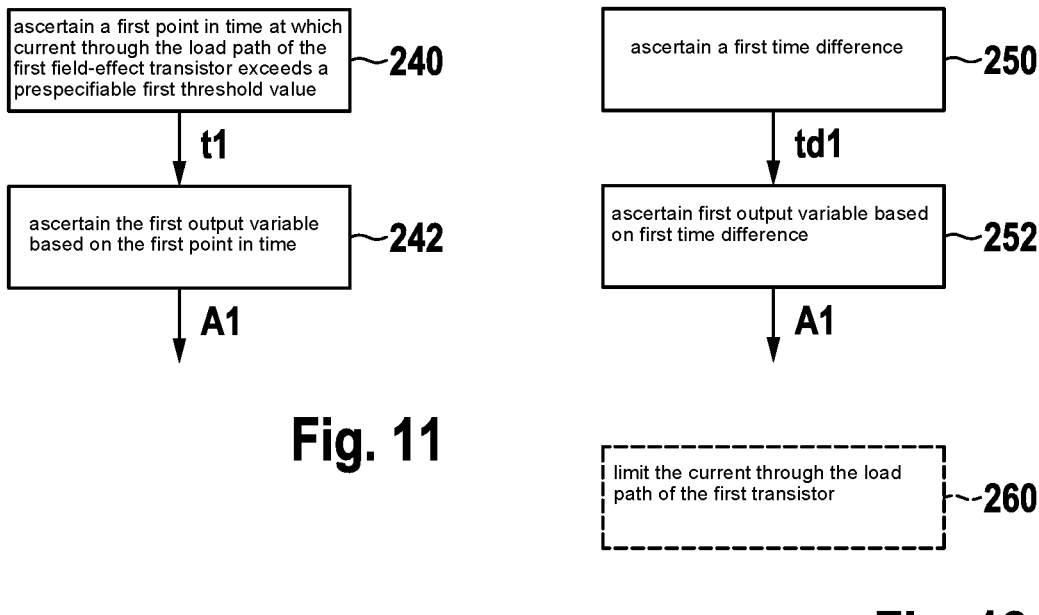
Fig. 11
Fig. 12 assign prespecifiable points in time to possible values for the corresponding first and/or second input variable — 330 assign use assign results in the future ⌐∼332

400 computer ∼402

404 volatile memory    storage device    non-volatile memory

404a    404b

DAT    PRG

406 data interface ← DCS computer-readable storage medium

∼SM

PRG'

VMM vector-matrix multiplication device

1000

500 execute compute-in-memory methods artificial neural networks artificial deep neural networks image processing efficient execution of calculations

501

502

503

504

505

506

507

508 increase efficiency for execution of calculations automated driving machine learning

METHOD FOR PROCESSING INPUT VARIABLES BY MEANS OF A PROCESSING DEVICE HAVING AT LEAST ONE TRANSISTOR, DEVICE FOR EXECUTING THE METHOD, COMPUTING DEVICE AND USE

FIELD

The present invention relates to a method for processing input variables by means of a processing device having at least one transistor.

The present invention further relates to a device for executing a method for processing input variables using a processing device having at least one transistor.

BACKGROUND INFORMATION

Exemplary embodiments of the present invention relate to a method for processing input variables by means of a processing device having at least a first transistor, for example a field-effect transistor, comprising: providing the first transistor and a first memristive element, which characterizes a first input variable associated with the first transistor, wherein a charging current of a capacitance associated with a control electrode of the first transistor can be influenced by means of the first memristive element; applying to the control electrode of the first transistor a first output variable which characterizes a second input variable associated with the first transistor; ascertaining a first output variable which characterizes at least one product of the first input variable and of the second input variable, on the basis of a first variable characterizing a time profile of a current through a load path of the first transistor. In further exemplary embodiments, a product of the first input variable and of the second input variable can thus, for example, be ascertained using the transistor, wherein at least one of the two input variables can be analog (i.e., for example, value-continuous).

In further exemplary embodiments of the present invention, the first transistor is, for example, a field-effect transistor, for example of the MOS (metal oxide semiconductor) type, for example an NMOS type. In further exemplary embodiments other types can also be used.

In further exemplary embodiments of the present invention, the principle according to the embodiments is also applicable to other transistor types than the field-effect transistors mentioned by way of example above. However, for reasons of comprehensibility and without limiting generality, an example of a use of field-effect transistors is assumed below. Therefore, the control electrode is, for example, a gate electrode, and the load path is, for example, a drain-source channel.

In further exemplary embodiments of the present invention, the memristive element is, for example, one of the following types: a) memristor; b) RRAM (resistive random-access memory); c) PCM (phase-change memory).

In further exemplary embodiments of the present invention, an electrical resistance of the memristive element is specifiable, for example, by programming, whereby a value for the first input variable can be assigned to the memristive element, which value, as already described above, acts on the charging current of the capacitance associated with the control electrode. For example, according to the value of the first input variable, the memristive element can limit the charging current, for example for a Miller capacitance of the first transistor, and thus realize, for example, a time behavior dependent on the Miller capacitance and on the value of the first input variable for activating (switching from a non-conductive state into a conductive state) the first transistor.

In further exemplary embodiments of the present invention, it is provided that the first variable is at least one of the following elements: a) the current through the load path itself; b) a voltage that can be ascertained on the basis of at least the current through the load path.

In further exemplary embodiments of the present invention, it is provided that the method comprises at least one of the following elements: a) using an intrinsic and/or parasitic capacitance, for example the Miller capacitance of the first transistor already mentioned by way of example above, as capacitance associated with the control electrode of the first transistor; b) providing an external, for example a non-intrinsic capacitance, for example in addition to one or the intrinsic capacitance, for the capacitance associated with the control electrode of the first transistor.

As an alternative or in addition to the intrinsic Miller capacitance, for example, in further exemplary embodiments of the control electrode of the present invention, a further capacitance can thus be assigned, for example for setting a prespecifiable capacitance value. In further exemplary embodiments, it is also possible to adjust the intrinsic capacitance within the framework of manufacturing conditions during a manufacturing process. In further exemplary embodiments, the charging of the above-described capacitance makes possible a defined activation of the transistor, i.e., for example, a shifting of the transistor from a, for example, blocking (high-impedance) state into a conductive (low-impedance) state.

In further exemplary embodiments of the present invention, it is provided that the method comprises: switching the first memristive element in series with the control electrode of the first transistor; applying the first control variable to the control electrode of the first transistor via the first memristive element. A charging current for the capacitance associated with the control electrode of the first transistor can thereby be limited by the memristive element, for example in the sense of the first input variable.

In further exemplary embodiments of the present invention, it is provided that the method comprises: switching the first memristive element in series with a load path of the first transistor, for example between a source electrode of the first transistor and a first reference potential, for example ground potential; applying, for example directly applying, the first control variable to the control electrode of the first transistor. Also in this configuration, the charging current for the capacitance associated with the control electrode of the first transistor can be limited by the memristive element, for example in the sense of the first input variable.

In further exemplary embodiments of the present invention, it is provided that the method comprises: providing a charging current for charging the capacitance associated with the control electrode of the first field-effect transistor, for example by means of a charging device.

In further exemplary embodiments of the present invention, it is provided that the method comprises: providing an input voltage based on the second input variable; applying the input voltage to the control electrode of the first transistor, optionally for example via a prespecifiable resistor, for example the first memristive element; and, optionally, at least periodically charging the capacitance associated with the control electrode of the first field-effect transistor. In further exemplary embodiments, by charging via the prespecifiable resistor, for example the first memristive element, the time behavior for charging the capacitance can be set (and thus, for example, for putting the load path of the transistor into a low-impedance state). In addition, the time behavior for charging depends on the input voltage, which can be selected, for example, on the basis of the second input variable.

In further exemplary embodiments of the present invention, it is provided that the method comprises: ascertaining a first point in time at which the current through the load path of the first field-effect transistor exceeds a prespecifiable first threshold value (for example, considered from the charging of the capacitance associated with the control electrode of the first field-effect transistor); ascertaining the first output variable on the basis of the first point in time.

In other words, using the principle according to the embodiments of the present invention, for example, a multiplication $a*b=c$ (* is the ("scalar") multiplication operator) can be evaluated using the first transistor, wherein the factor a corresponds to, for example, the first input variable (for example, the programmed resistance value or programmed conductivity of the first memristive element) and wherein the factor b corresponds to, for example, the second input variable (for example, the input voltage for charging the capacitance associated with the control electrode of the first transistor).

In further exemplary embodiments of the present invention, a prespecifiable value for the result of the multiplication $a*b=c$, i.e. for the product c, can accordingly be assigned to the first point in time at which the current through the load path of the first transistor exceeds the prespecifiable first threshold value. In further exemplary embodiments, different result values for the product c can in a comparable manner be assigned to different points in time—for example, calculated after the start of the charging process—so that in further exemplary embodiments, for example based on a specific value of the first point in time, the corresponding result value for the product c can be deduced.

In other words, in further exemplary embodiments of the present invention, a time measurement can be carried out, on the basis of which the product c can be ascertained. This is advantageous in further exemplary embodiments since the time measurement can be carried out very efficiently and/or precisely with currently available technology.

In further exemplary embodiments of the present invention, it is provided that the prespecifiable first threshold value corresponds to at least one of the following elements: a) saturation current of the first transistor; b) limit current to which the current through the load path of the first transistor can be limited and/or is limited, for example by means of at least one limiting resistor connected in series with the load path; c) any prespecifiable current value.

In further exemplary embodiments of the present invention, it is provided that the method comprises: ascertaining a first time difference between a start of the application of the first control variable to the control electrode of the first transistor and a first point in time, for example the first point in time at which the current through the load path of the first transistor exceeds a first threshold value, for example the prespecifiable first threshold value; and ascertaining the first output variable on the basis of the first time difference, for example using an assignment of possible time differences to possible multiplication results $c=a*b$.

In further exemplary embodiments of the present invention, it is provided that the method comprises: limiting the current through the load path of the first transistor by means of at least one limiting resistor connected in series with the load path.

In further exemplary embodiments of the present invention, it is provided that the processing device has at least one further transistor, for example a field-effect transistor, wherein a corresponding first terminal of a load path of the first transistor and of the at least one further transistor is connected to a first circuit node, wherein the method comprises: providing the at least one further transistor and a corresponding further memristive element which characterizes a first input variable associated with the at least one further transistor, wherein a charging current of a capacitance associated with a control electrode of the at least one further transistor can be influenced by means of the corresponding further memristive element; applying to a corresponding control electrode of the at least one further transistor the first output variable, which characterizes a second input variable associated with the corresponding further transistor; ascertaining the first output variable, which characterizes for example a sum of the respective products of the corresponding first input variable and of the corresponding second input variable, on the basis of a second variable characterizing a time profile of a current associated with the first circuit node, wherein for example the second variable is at least one of the following elements: a) the current itself associated with the first circuit node; b) a voltage that can be ascertained on the basis of at least the current associated with the first circuit node. In further exemplary embodiments, a calculation of the MAC (multiply and accumulate) type is hereby made possible, wherein the first transistor and the at least one further, e.g. second, transistor, for example, in each case perform a multiplication, for example analogous to the embodiments described above by way of example. An accumulation, for example addition, takes place here, for example, by the respective load paths of the two transistors being connected to the first circuit node, namely, for example, by an addition of the currents of the two transistors.

For example, in the above-mentioned configuration, a first product $c1=a1*b1$ can be ascertained by the first transistor on the basis of the factors a1, b1 (for example, can be realized by programming a corresponding resistance value for the first memristive element and/or specifying a corresponding input voltage for charging, for example, the intrinsic capacitance of the first transistor), and a second product $c2=a2*b2$ can be ascertained by the second transistor on the basis of the factors a2, b2 for the first second element (for example, can be realized by programming a corresponding resistance value for the second memristive element and/or specifying a corresponding input voltage for charging, for example, the intrinsic capacitance of the second transistor), wherein an accumulation, for example addition, $c1+c2$ can be performed by the combination of the respective load currents through the load paths of the two transistors in the first circuit node. Even in exemplary embodiments with more than one transistor, the result $c1+c2$ of the MAC calculation can be deduced on the basis of the second variable and a possibly effected assignment of points in time at which one or more corresponding threshold values are exceeded by the second variable.

In further exemplary embodiments of the present invention, it is provided that the processing device comprises n many, $n>1$, transistors each having an associated memristive element, wherein a corresponding first terminal of a load path of the n many transistors is connected to a, for example the, first circuit node, wherein the method comprises: providing a k-th transistor, $k=1, \ldots, n$, (for example all n many transistors) with a k-th memristive element which characterizes a corresponding first input variable associated with the k-th transistor; applying to a (corresponding) control electrode of the k-th transistor (for example of all n many transistors) a k-th control variable which characterizes a corresponding second input variable associated with the k-th transistor; ascertaining the first output variable, which characterizes, for example, a sum of k many products of the corresponding first input variable and the corresponding second input variable, on the basis of a or the second variable characterizing the time profile of the current associated with the first circuit node. In further exemplary embodiments, the principle according to the embodiments can thus be extended to any number n of transistors, so that, for example, MAC calculations are possible which makes possible a formation of, for example maximally, n many products and an accumulation of the, for example maximally, n many products. In further exemplary embodiments, such calculations can be used, for example, for the evaluation (inference) of artificial (deep) neural networks ((D)NN).

In further exemplary embodiments of the present invention, it is provided that the method comprises: starting the application of the first control variable to the control electrode of the first transistor at a starting point in time; repeatedly, for example, periodically, for example continuously, ascertaining the second variable, for example during a prespecifiable time period from the starting point in time.

In further exemplary embodiments of the present invention, it is provided that the method comprises: ascertaining changes in the second variable at prespecifiable points in time, wherein, for example, the prespecifiable points in time are in each case associated with possible values for the corresponding first input variable and/or for the corresponding second input variable; weighting the ascertained changes of the second variable, wherein weighted changes are obtained, and, optionally, ascertaining the first output variable by summing the weighted changes in the second variable.

In further exemplary embodiments of the present invention, such changes, for example, which are associated with a transition of at least one of the transistors used from a high-impedance state to a low-impedance state, can be considered changes in the second variable which are to be ascertained. If, for example, a maximum current through a load path of at least one of the transistors used is 100 nA, then in further exemplary embodiments a change in the second variable in the range of approximately 100 nA can be taken into account. In further exemplary embodiments, changes in the second variable, which, for example, are significantly less than 100 nA, can be left disregarded, for example if none of the transistors used has a correspondingly lower maximum current than the 100 nA mentioned.

In further exemplary embodiments of the present invention, it is provided that the method comprises: repeating the ascertainment and weighting, for example until a prespecifiable abort criterion is met.

In further exemplary embodiments of the present invention, the abort criterion is an elapsing of a prespecifiable maximum measuring time, for example prespecifiable on the basis of a number of transistors used and/or on the corresponding first and/or second input variable of at least one of the transistors used.

In further exemplary embodiments of the present invention, the abort criterion is met when the second variable has a maximum value dependent for example on the configuration (for example, number of transistors) of the processing device (for example, maximum current at the first node corresponds, for example, to a state in which all of the transistors are low-impedance).

In further exemplary embodiments of the present invention, it is provided that the method comprises: assigning the prespecifiable points in time (for example, associated with the changes of the second variable) to possible values for the corresponding first input variable and/or for the corresponding second input variable.

Further exemplary embodiments relate to a device for executing the method according to the embodiments.

In further exemplary embodiments of the present invention, it is provided that the device has a processing device having at least a first transistor, for example a field-effect transistor, wherein, for example, the processing device has n many, n>1, transistors, for example field-effect transistors.

In further exemplary embodiments of the present invention, it is provided that the device comprises at least one charging device for providing a charging current for the at least one transistor.

In further exemplary embodiments of the present invention, it is provided that the device has at least one measuring device, for example a current-based analog/digital converter, for ascertaining at least one of the following variables: a) first variable; b) second variable.

In further exemplary embodiments of the present invention, it is provided that the device has a control device which is designed to execute at least one of the following elements: a) control of at least one component of the device; b) execution of at least one aspect of the method according to the embodiments.

Further exemplary embodiments of the present invention relate to a computing device, for example a vector-matrix multiplication device, comprising at least one device according to the embodiments.

Further exemplary embodiments of the present invention relate to a use of the method according to the embodiments and/or of the device according to the embodiments and/or of the computing device according to the embodiments for at least one of the following elements: a) execution of compute-in-memory methods, for example with weights and/or input variables which can in each case have a plurality of bits; b) artificial neural networks, for example artificial deep neural networks; c) image processing; d) efficient execution of calculations; e) increasing an efficiency for the execution of calculations; f) automated driving; g) machine learning, for example inference.

Further features, possible applications and advantages of the present invention will be apparent from the following description of exemplary embodiments of the present invention shown in the figures. In this case, all of the features described or shown form the subject matter of the present invention individually or in any combination, irrespective of their wording or representation in the description or in the figures.

BRIEF DESCRIPTION OF THE DRAWINGS

FIG. 3 schematically shows a simplified flowchart according to exemplary embodiments of the present invention.

FIG. 4 schematically shows a simplified flowchart according to exemplary embodiments of the present invention.

FIG. 5 schematically shows a simplified circuit diagram according to exemplary embodiments of the present invention.

FIG. 6 schematically shows a simplified flowchart according to exemplary embodiments of the present invention.

FIG. 7 schematically shows a simplified circuit diagram according to exemplary embodiments of the present invention.

FIG. 8 schematically shows a simplified flowchart according to exemplary embodiments of the present invention.

FIG. 9 schematically shows a simplified flowchart according to exemplary embodiments of the present invention.

FIG. 10 schematically shows a simplified circuit diagram according to exemplary embodiments of the present invention.

FIG. 11 schematically shows a simplified flowchart according to exemplary embodiments of the present invention.

FIG. 12 schematically shows a simplified flowchart according to exemplary embodiments of the present invention.

DETAILED DESCRIPTION OF EXAMPLE EMBODIMENTS

Figure 1:
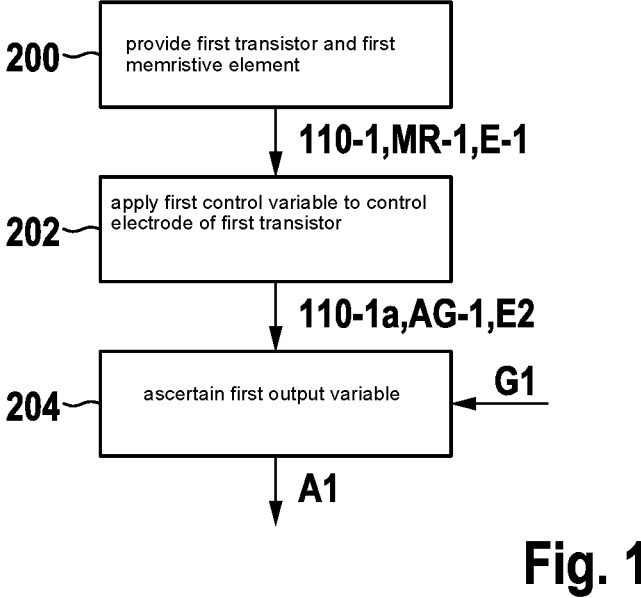
FIG. 1 schematically shows a simplified flowchart according to exemplary embodiments of the present invention.
Figure 2:
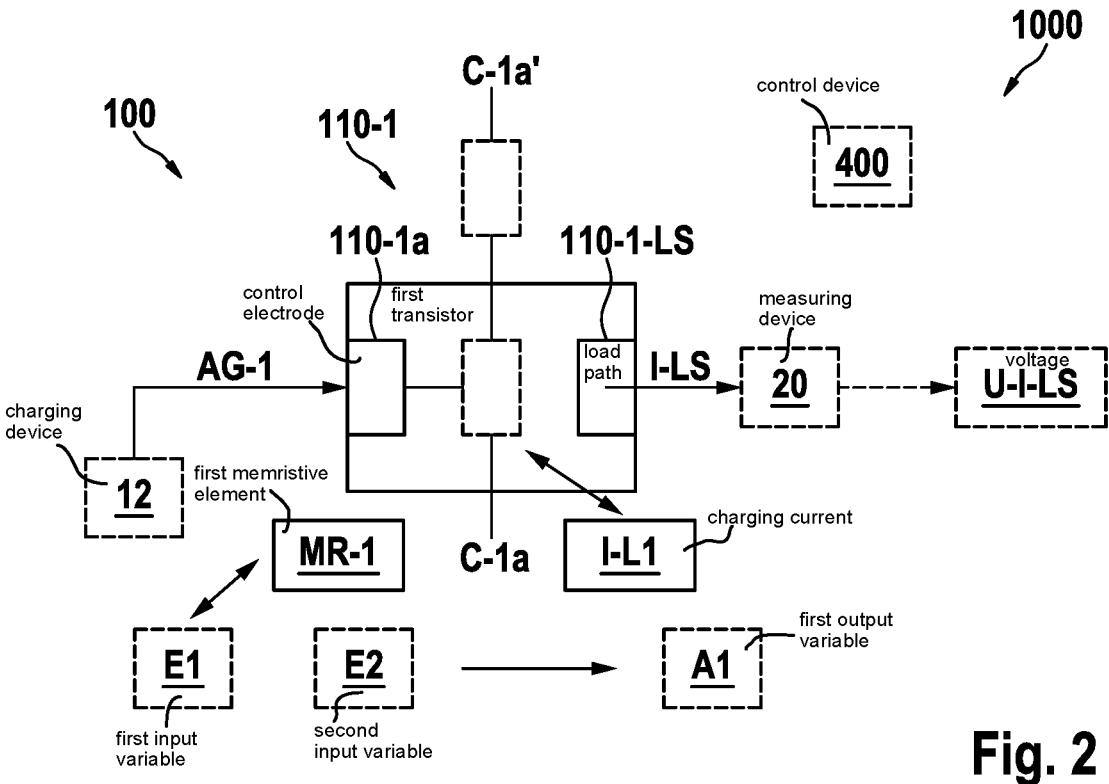
FIG. 2 schematically shows a simplified block diagram according to exemplary embodiments of the present invention.

Exemplary embodiments of the present invention, see FIGS. 1 and 2, relate to a method for processing input variables by means of a processing device 100, having at least a first transistor 110-1, for example a field-effect transistor (FIG. 2), comprising: providing 200 the first transistor 110-1 and a first memristive element MR-1, which characterizes a first input variable E1 associated with the first transistor 110-1, wherein a charging current I-L1 of a capacitance C-1$a$ associated with a control electrode 110-1$a$ of the first transistor 110-1 can be influenced by means of the first memristive element MR-1; applying 202 to the control electrode 110-1$a$ of the first transistor 110-1 a first control variable AG-1 which characterizes a second input variable E2 associated with the first transistor 110-1; ascertaining 204 a first output variable A1 which characterizes at least one product of the first input variable E1 and of the second input variable E2 on the basis of a first variable G1 characterizing a time profile of a current I-LS through a load path 110-1-LS of the first transistor 110-1. In further exemplary embodiments, for example, a product of the first input variable E1 and of the second input variable E2 can thus be ascertained using the first transistor 110-1, wherein at least one of the two input variables E1, E2 can be analog (i.e., for example, value-continuous).

In further exemplary embodiments, the first transistor is, for example, a field-effect transistor, for example of the MOS (metal oxide semiconductor) type, i.e. a MOSFET, for example of the NMOS type. In further exemplary embodiments other types can also be used.

In further exemplary embodiments, the principle according to the embodiments is also applicable to other transistor types than the field-effect transistors mentioned by way of example above, for example MOSFETs. However, for reasons of comprehensibility and without limiting generality, an example of a use of field-effect transistors is assumed below. Therefore, the control electrode 110-1$a$ is, for example, a gate electrode, and the load path 110-1-LS is, for example, a drain-source channel.

In further exemplary embodiments, the first memristive element MR-1 is, for example, one of the following types: a) memristor; b) RRAM (resistive random-access memory); c) PCM (phase-change memory).

In further exemplary embodiments, an electrical resistance of the memristive element MR-1 is specifiable, for example by programming, whereby a value for the first input variable E1 can be assigned to the memristive element, which value acts as already described above on the charging current I-L1 of the capacitance C-1$a$ associated with the control electrode 110-1$a$. For example, according to the value of the first input variable E1, the first memristive element MR-1 can limit the charging current I-L1, for example for a Miller capacitance of the first transistor 110-1, and thus, for example, realize a time behavior dependent on the Miller capacitance and on the value of the first input variable E1 for activating (switching from a non-conducting state into a conductive state) the first transistor 110-1.

In further exemplary embodiments, it is provided that the first variable G1 is at least one of the following elements: a) the current I-LS through the load path 110-1-LS itself; b) a voltage U-I-LS which can be ascertained on the basis of at least the current I-LS through the load path 110-1-LS.

In further exemplary embodiments, FIG. 3, it is provided that the method comprises at least one of the following elements: a) using 210 an intrinsic and/or parasitic capacitance C-1$a$, for example the Miller capacitance of the first transistor 110-1, which has already been mentioned by way of example above, as the capacitance associated with the control electrode 110-1$a$ of the first transistor 110-1; b) providing 212 an external, for example non-intrinsic, capacitance C-1$a$', for example in addition to a or the intrinsic capacitance, for the capacitance C-1$a$ associated with the control electrode 110-1$a$ of the first transistor 110-1.

As an alternative or in addition to the intrinsic Miller capacitance, for example, in further exemplary embodiments of the control electrode 110-1$a$, a further capacitance C-1$a$' can thus be assigned, for example for setting a prespecifiable capacitance value. In further exemplary embodiments, it is also possible to adjust the intrinsic capacitance within the framework of manufacturing conditions during a manufacturing process. In further exemplary embodiments, the charging of the above-described capacitance C-1$a$ makes possible a defined activation of the first transistor 110-1, i.e., for example, a shifting of the first transistor 110-1 from a, for example, blocking (high-impedance) state into a conductive (low-impedance) state.

In further exemplary embodiments, FIG. 4, 5, it is provided that the method comprises: switching 215 the first memristive element MR-1 in series with the control electrode 110-1$a$ of the first transistor 110-1; applying 216 the first control variable AG-1 to the control electrode 110-1$a$ of the first transistor 110-1 via the first memristive element MR-1. A charging current I-L1 (FIG. 2) for the capacitance C-1$a$ associated with the control electrode 110-1$a$ of the first transistor 110-1 can thereby be limited by the first memristive element MR-1, for example in the sense of the first input variable E1.

In further exemplary embodiments, FIG. 5, an optional current-limiting resistor R-1 is provided, for example connected in series with the load path 110-1-LS. For example, the optional current-limiting resistor R-1 can be used if the first transistor 110-1 does not already intrinsically limit the current I-LS. Alternatively to or in addition to the optional current-limiting resistor R-1, in further exemplary embodiments, for example, a value range for the first control variable AG-1 can also be limited in order to effect the current limitation mentioned.

In further exemplary embodiments, an output current of the first transistor can be set efficiently and, for example, comparatively precisely by the exemplary configuration according to FIG. 5.

In further exemplary embodiments, a MAC calculation is made possible by the exemplary configuration according to FIG. 5, on the basis of the first control variable AG-1 and on a conductivity of the first memristive element MR-1, for example as a product of the first control variable AG-1 and of the conductivity of the first memristive element MR-1.

In further exemplary embodiments, FIG. 6, 7, it is provided that the method comprises: switching 218 the first memristive element MR-1 in series with a load path 110-1-LS of the first transistor 110-1, for example between a source electrode 110-1-$b$ of the first transistor 110-1 and a first reference potential BP-1, for example ground potential; applying, for example applying directly, 219 the first control variable AG-1 to the control electrode 110-1$a$ of the first transistor 110-1. Also in this configuration, the charging current I-L1 (FIG. 2) for the capacitance C-1$a$ (FIG. 2) associated with the control electrode 110-1$a$ of the first transistor 110-1 can be limited by the first memristive element MR-1, for example in the sense of the first input variable E1.

In further exemplary embodiments, in the case of the configuration according to FIG. 7, although an output current I-LS can be influenced by the first memristive element MR-1, with a suitable evaluation, for example, time changes of the output current I-LS do not however impair the usability of this configuration for performing, for example, multiplications or MAC calculations (for example, in combination with further transistors and associated memristive elements).

In further exemplary embodiments, FIG. 8, it is provided that the method comprises: providing 220 a charging current I-L for charging 222 the capacitance C-1$a$ associated with the control electrode 110-1$a$ of the first field-effect transistor 110-1, for example by means of a charging device 12 (FIG. 2).

In further exemplary embodiments, FIG. 9, 10, it is provided that the method comprises: providing 230 an input voltage V-1 based on the second input variable E2; applying 232 the input voltage V-1 to the control electrode 110-1$a$ (FIG. 10) of the first transistor 110-1, optionally for example via a prespecifiable resistor 12$b$ (FIG. 10), for example the first memristive element MR-1 (FIG. 2); and, optionally, at least periodically, charging 234 (FIG. 9) the capacitance C-1$a$ associated with the control electrode 110-1$a$ of the first field-effect transistor 110-1. In further exemplary embodiments, by charging 234 via the prespecifiable resistor 12$b$, for example the first memristive element MR-1, the time behavior for charging the capacitance C-1$a$ can be set (and thus, for example, for putting the load path of the first transistor 110-1 into a low-impedance state). In addition, the time behavior for charging depends on the input voltage V-1, which can be selected, for example, on the basis of the second input variable E2.

Element 12$a$ from FIG. 10 symbolizes a voltage source for providing the input voltage V-1 according to exemplary embodiments.

In further exemplary embodiments, FIG. 11, it is provided that the method comprises: ascertaining 240 a first point in time t1 at which the current I-LS through the load path 110-1-LS of the first field-effect transistor 110-1 exceeds a prespecifiable first threshold value (for example, considered from the charging of the capacitance associated with the control electrode of the first field-effect transistor); ascertaining 242 the first output variable A1 on the basis of the first point in time t1.

In other words, using the principle according to the embodiments, for example, a multiplication a*b=c (* is the ("scalar") multiplication operator) can be evaluated using the first transistor 110-1, wherein the factor a corresponds, for example, to the first input variable E1 (for example, the programmed resistance value or programmed conductivity of the first memristive function element MR-1), and wherein the factor b corresponds, for example, to the second input variable E2 (for example, the input voltage V-1 for charging the capacitance C-1$a$ associated with the control electrode 110-1$a$ of the first transistor 110-1).

In further exemplary embodiments, a prespecifiable value for the result of the multiplication a*b=c, i.e. for the product c, can accordingly be assigned to the first point in time t1 at which the current I-LS through the load path of the first transistor 110-1 exceeds the prespecifiable first threshold value. In a comparable manner, in further exemplary embodiments, different result values for the product c can in a comparable manner be assigned to different points in time—for example, calculated after the start of the charging process-so that in further exemplary embodiments, for example on the basis of a specific value of the first point in time t1, the corresponding result value for the product c can be deduced.

In other words, in further exemplary embodiments, a time measurement can be carried out, on the basis of which the product c can be ascertained. This is advantageous in further exemplary embodiments since the time measurement can be carried out very efficiently and/or precisely with currently available technology.

In further exemplary embodiments, it is provided that the prespecifiable first threshold value corresponds to at least one of the following elements: a) saturation current of the first transistor 110-1; b) limit current to which the current through the load path I-LS of the first transistor 110-1 can be limited and/or is limited, for example by means of at least one limiting resistor R-1 (optional, see FIG. 5) connected in series with the load path; c) any prespecifiable current value.

In further exemplary embodiments, FIG. 12, it is provided that the method comprises: ascertaining 250 a first time difference td1 between a start of the application of the first control variable AG-1 to the control electrode 110-1$a$ of the first transistor and a, for example the, first point in time at which the current through the load path of the first transistor exceeds a, for example the, first prespecifiable threshold value; and ascertaining 252 the first output variable A1 on the basis of the first time difference td1, for example using an assignment of possible time differences to possible multiplication results c=a*b.

In further exemplary embodiments, FIG. 12, it is provided that the method comprises: limiting 260 the current I-LS through the load path 110-1-LS of the first transistor 110-1 by means of at least one limiting resistor R-1 (FIG. 5) connected in series with the load path 110-1-LS.

Figure 13:
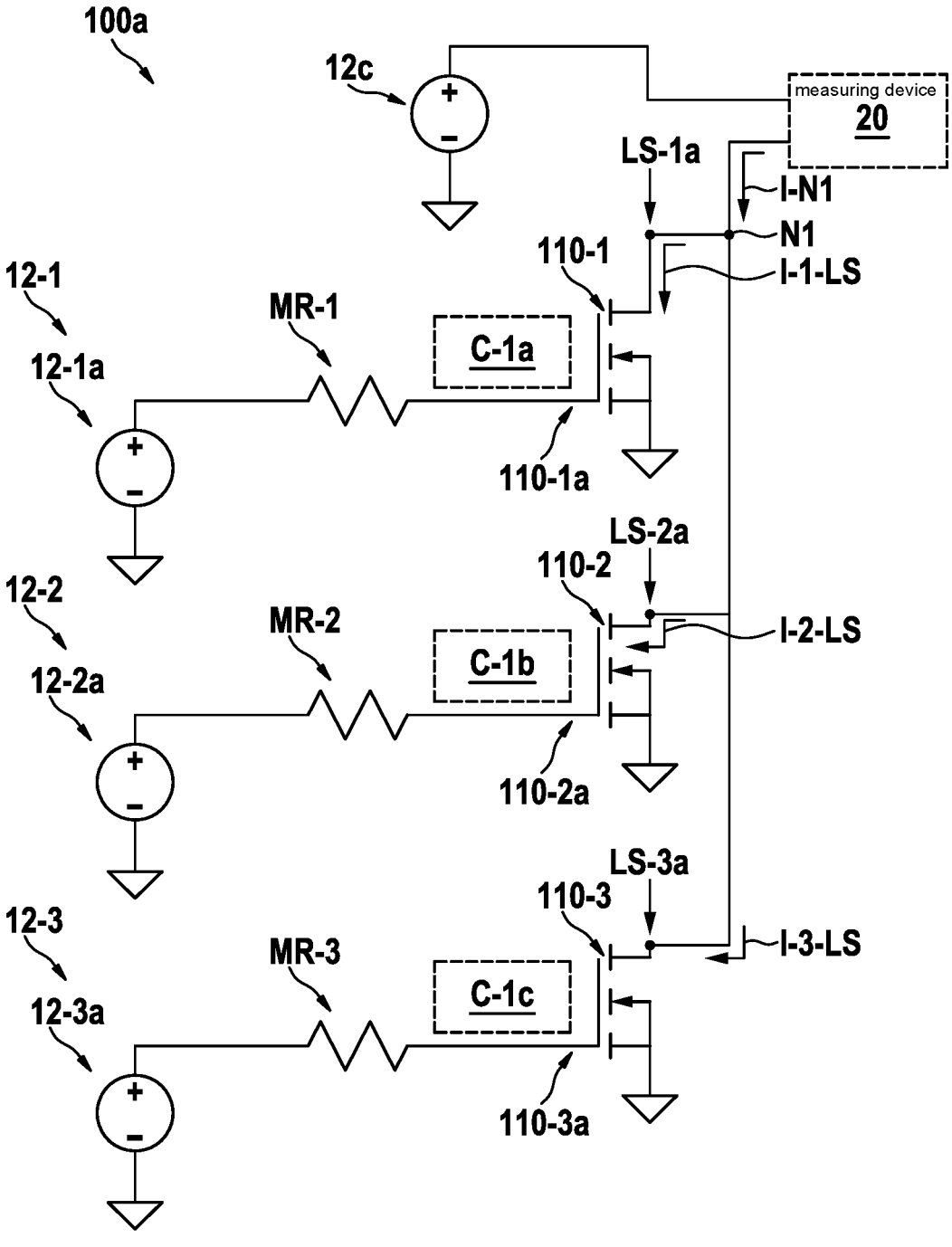
FIG. 13 schematically shows a simplified circuit diagram according to exemplary embodiments of the present invention.
Figure 14:
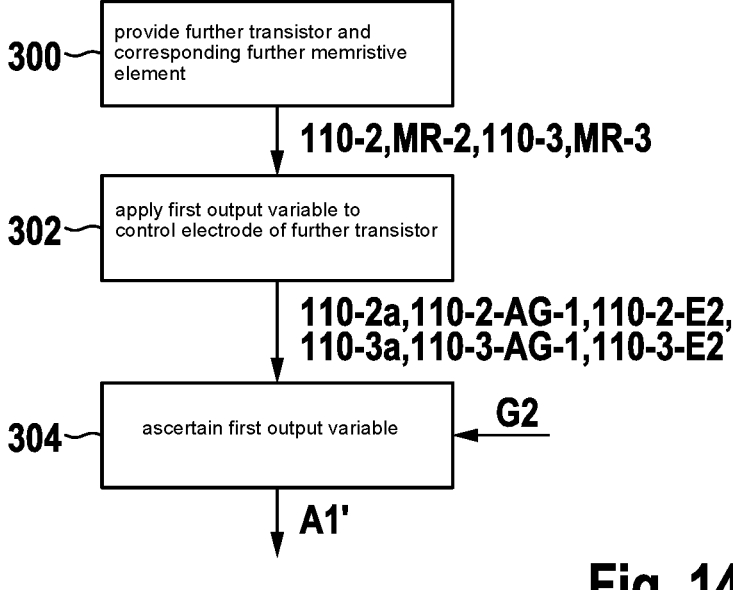
FIG. 14 schematically shows a simplified flowchart according to exemplary embodiments of the present invention.

In further exemplary embodiments, FIG. 13, 14, it is provided that the processing device 100*a* has at least one further transistor, for example a field-effect transistor, (in the present case two further field-effect transistors) 110-2, 110-3 (FIG. 13), wherein a corresponding first terminal LS-1*a*, LS-2*a*, LS-3*a* of a load path of the first transistor 110-1 and of the at least one further transistor 110-2, 110-3 is connected to a first circuit node N1, wherein the method comprises: providing 300 (FIG. 14) the at least one further transistor 110-2, 110-3, and a corresponding further memristive element MR-2, MR-3 which characterizes a first input variable associated with the at least one further transistor 110-2, 110-3, wherein a charging current of a capacitance C-1*b*, C-1*c* associated with a control electrode 110-2*a*, 110-3*a* of the at least one further transistor 110-2, 110-3 can be influenced by means of the corresponding further memristive element MR-2, MR-3; applying 302 to a corresponding control electrode 110-2*a*, 110-3*a* of the at least one further transistor 110-2, 110-3 the first output variable 110-2-AG-1, 110-3-AG-1, which characterizes a second input variable 110-2-E2, 110-3-E2 associated with the corresponding further transistor 110-2, 110-3; ascertaining 304 the first output variable A1', which characterizes, for example, a sum of respective products of the corresponding first input variable and of the corresponding second input variable, on the basis of a second variable G2 characterizing a time profile of a current I-N1 associated with the first circuit node N1; wherein, for example, the second variable G2 is at least one of the following elements: a) the current I-N1 itself associated with the first circuit node N1; b) a voltage that can be ascertained on the basis of at least the current I-N1 associated with the first circuit node N1. In further exemplary embodiments, a calculation of the MAC (multiply and accumulate) type is for example hereby made possible, wherein the first transistor 110-1 and the at least one further, for example second, transistor 110-2 in each case perform a multiplication, for example analogous to the embodiments described above by way of example. An accumulation, for example addition, takes place here, for example, by the respective load paths of the two transistors 110-1, 110-2 being connected to the first circuit node N1, namely, for example, by an addition of the currents I-1-LS, I-2-LS of the two transistors 110-1, 110-2. The same also applies to any further transistors 110-3 that may be present.

For example, in the above-mentioned configuration a first product c1=a1*b1 can be ascertained by the first transistor 110-1 on the basis of the factors a1, b1 (for example, can be realized by programming a corresponding resistance value for the first memristive element MR-1 and/or specifying a corresponding input voltage for charging, for example, the intrinsic capacitance of the first transistor), and a second product c2=a2*b2 can be ascertained by the second transistor 110-2 on the basis of the factors a2, b2 (for example, can be realized by programming a corresponding resistance value for the second memristive element MR-2 and/or specifying a corresponding input voltage for charging, for example, the intrinsic capacitance of the second transistor), wherein an accumulation, for example addition, c1+c2 can be carried out by the combination of the corresponding load currents through the load paths of the two transistors in the first circuit node N1. Even in exemplary embodiments with more than one transistor, the result c1+c2 of the MAC calculation can also be deduced on the basis of the second variable G2 and a possibly effected assignment of points in time at which one or more corresponding threshold values are exceeded by the second variable G2.

The elements 12-1*a*, 12-2*a*, 12-3*a* according to FIG. 13 symbolize voltage sources which characterize the corresponding second input variable E2, 110-2-E2, 110-3-E2.

The element 12*c* according to FIG. 13 symbolizes an optional operating voltage supply.

In further exemplary embodiments, FIG. 13, it is provided that the processing device 100*a* has n many (in the present case, by way of example, n=3), n>1, transistors 110-1, 110-2, 110-3 with in each case an associated memristive element MR-1, MR-2, MR-3, wherein a corresponding first terminal LS-1*a*, LS-2*a*, LS-3*a* of a load path of the n many transistors 110-1, 110-2, 110-3 is connected to a, for example the, first circuit node N1, wherein the method comprises: providing a k-th transistor, k=1, . . . , n, (for example, of all n many transistors) with a k-th memristive element characterizing a corresponding first input variable associated with the k-th transistor; applying to a (corresponding) control electrode of the k-th transistor (for example, of all n many transistors) a k-th control variable which characterizes a corresponding second control variable associated with the k-th transistor; ascertaining the first output variable, which characterizes, for example, a sum of k many products of the corresponding first input variable and of the corresponding second input variable, on the basis of one or the second variable characterizing the time profile of the current associated with the first circuit node. In further exemplary embodiments, the principle according to the embodiments can thus be extended to any number n of transistors, so that, for example, MAC calculations are possible which makes possible a formation of, for example maximally, n many products and an accumulation of the, for example maximally, n many products. In further exemplary embodiments, such calculations can be used, for example, for the evaluation (inference) of artificial (deep) neural networks ((D) NN).

Figure 15:
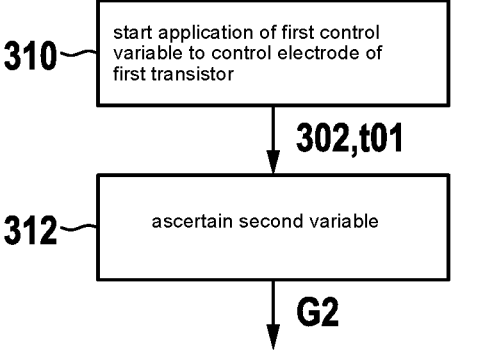
FIG. 15 schematically shows a simplified flowchart according to exemplary embodiments of the present invention.

In further exemplary embodiments, FIG. 15, it is provided that the method comprises: starting 310 the application 302 of the first control variable AG-1 to the control electrode 110-1*a* of the first transistor 110-1 at a starting point in time t01; repeatedly, for example periodically, for example continuously, ascertaining 312 the second variable G2, for example during a prespecifiable time period from the starting point in time t01.

Figure 17:
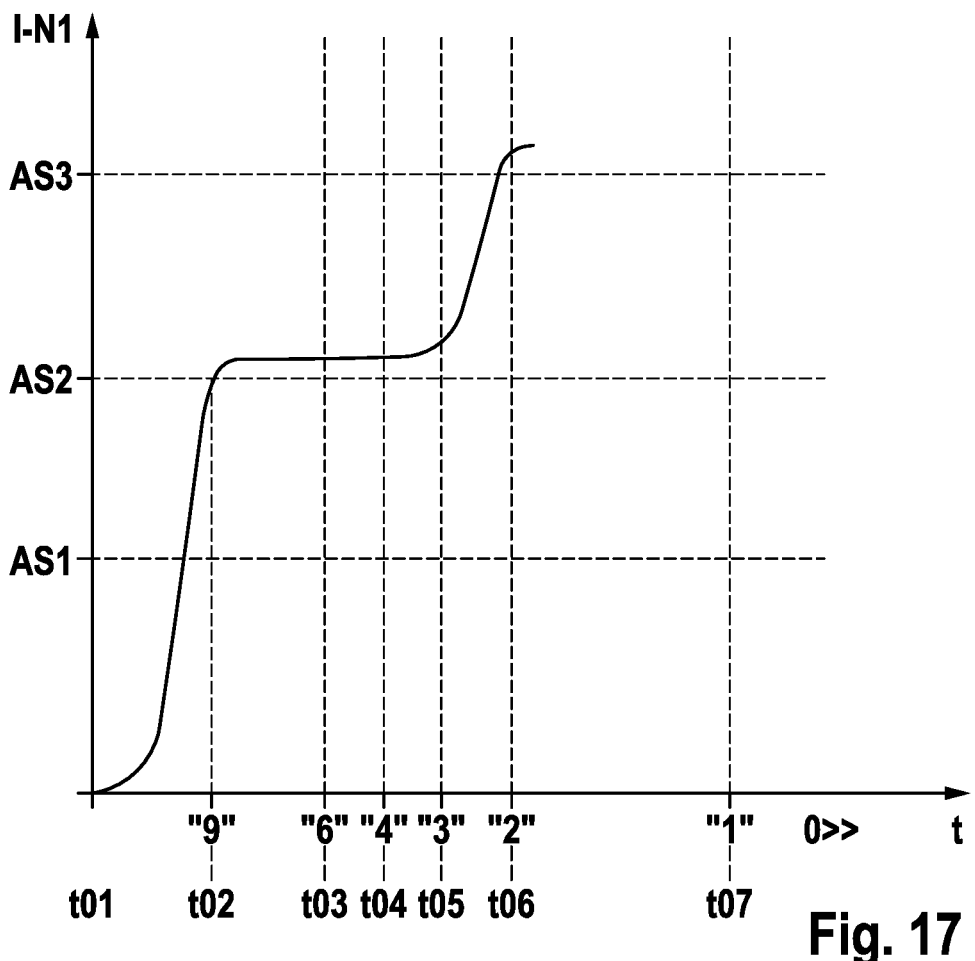
FIG. 17 schematically shows a simplified time diagram according to exemplary embodiments of the present invention.

In this regard, FIG. 17 schematically shows a time profile of the current I-N1 through the first circuit node N1, as can result, for example, in a processing device 100*a* according to FIG. 13 with three field-effect transistors (FETs) 110-1, 110-2, 110-3 with in each case an associated memristive element MR-1, MR-2, MR-3, and associated result values "9," "6," "4," "3," "2," "1" at associated points in time t02, t03, t04, t05, t06, t07 according to exemplary embodiments. For example, it can be seen from FIG. 17 that the current I-N1 increases comparatively sharply between the starting point in time t01 and the point in time t02, for example corresponding to two of three possible amplitude steps AS1, AS2, AS3, cf. the vertical axis, there the value AS2, which, for example, results from the fact that two of the three FETs according to FIG. 13 have changed from their blocking state to their conductive state within the time interval (t01, t02). If, for example, a current through the load path of the FETs according to FIG. 13 is limited to a default value of, for example, 100 nA, for example by means of a corresponding limiting resistor R-1, not shown in FIG. 13 for reasons of clarity, for example an amplitude step AS1 or a difference AS2-AS1, AS3-AS2 between two adjacent amplitude steps will correspond to the exemplary 100 nA.

The exemplary current rise in the time interval (t01, t02) can thus be interpreted as a contribution "2*9" to the result of the MAC calculation, wherein the value 9 results from the assignment of the value "9" at the point in time t02 (reaching the second amplitude step AS2), and wherein the factor "2" results from the fact that the current rise in the time interval (t01, t02) corresponds to two amplitude steps, i.e. from zero to AS2.

A further current rise takes place according to FIG. 17 only later in a time interval (t05, t06), namely by one amplitude step, i.e., to the maximum possible third amplitude step AS3 in the present case (for example, due to a limitation of the current through all three FeFETs 110-1, 110-2, 110-3 to 100 nA in each case). The exemplary current rise in the time interval (t05, t06) can thus be interpreted, for example, as a contribution "1*2" to the result of the MAC calculation, wherein the value 2 results from the assignment of the value "2" at the point in time t06 (reaching the third amplitude step AS3), and wherein the factor "1" results from the fact that the current rise in the time interval (t05, t06) corresponds to one amplitude step, i.e. from AS2 to AS3.

In further exemplary embodiments, the result of the MAC calculation can thus be interpreted as $2*9+1*2=20$.

Figure 16:
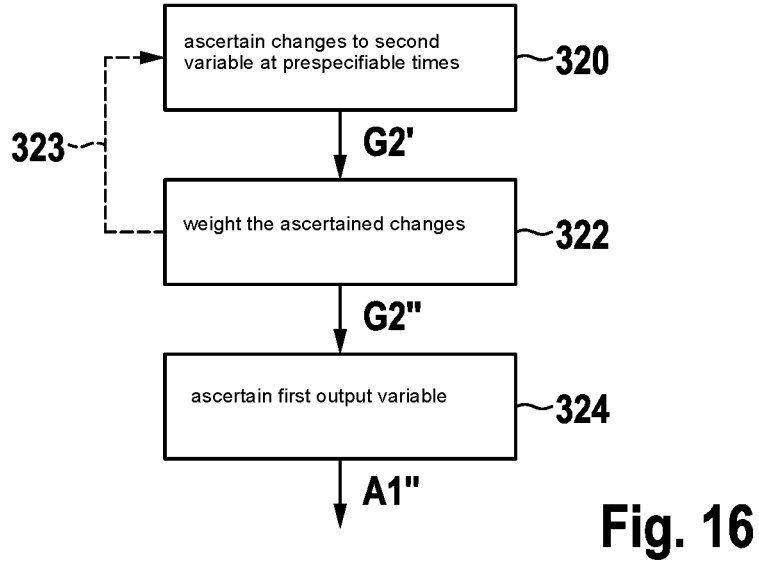
FIG. 16 schematically shows a simplified flowchart according to exemplary embodiments of the present invention.

In further exemplary embodiments, FIG. 16, it is provided that the method comprises: ascertaining 320 changes G2' of the second variable G2 at prespecifiable times, wherein, for example, the prespecifiable points in time are in each case associated with possible values for the corresponding first input variable E1 and/or for the corresponding second input variable E2; weighting 322 the ascertained changes G2' of the second variable G2, wherein weighted changes G2" are obtained; and, optionally, ascertaining 324 the first output variable A1" by summing the weighted changes G2" of the second variable G2.

In further exemplary embodiments, such changes for example, which are associated with a transition of at least one of the transistors 110-1, 110-2, . . . from a high-impedance state to a low-impedance state, can be considered changes of the second variable G2 which are to be ascertained. If, for example, a maximum current through a load path of at least one of the transistors used is 100 nA, then in further exemplary embodiments a change of the second variable G2 in the range of approximately 100 nA can be taken into account. In further exemplary embodiments, changes in the second variable G2, which, for example, are significantly less than 100 nA, can be left disregarded, for example if none of the transistors used has a correspondingly lower maximum current than the 100 nA mentioned.

In further exemplary embodiments, FIG. 16, it is provided that the method comprises: repeating 323 the ascertainment 320 and the weighting 322, for example until a prespecifiable abort criterion is met.

In further exemplary embodiments, the abort criterion is an elapsing of a prespecifiable maximum measuring time, for example prespecifiable on the basis of a number of transistors 110-1, 110-2, . . . used and/or on the corresponding first and/or second input variables of at least one of the transistors used.

In further exemplary embodiments, the abort criterion is met when the second variable G2 has a maximum value dependent for example on the configuration (for example, number of transistors) of the processing device 100, 100a (for example, the maximum current at the first node N1, corresponds, for example, to a state in which all of the transistors are low-impedance).

Figure 18:
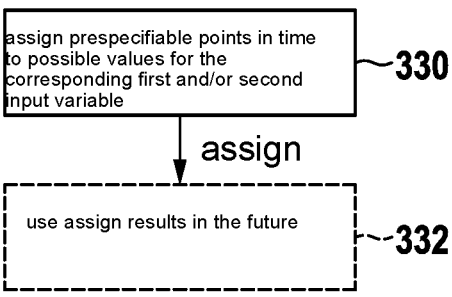
FIG. 18 schematically shows a simplified flowchart according to exemplary embodiments of the present invention.

In further exemplary embodiments, FIG. 18, it is provided that the method comprises: assigning 330 the prespecifiable points in time t02, t03, . . . (FIG. 17) (for example, associated with the changes of the second variable G2) to possible values "9," "6," . . . for the corresponding first input variable and/or for the corresponding second input variable. In this case, according to FIG. 18, for example, the assignment ASSIGN results, which can optionally be used in the future for performing MAC calculations; see the optional block 332.

In further exemplary embodiments, even a value of zero, i.e., c=0, can occur as a result of a multiplication $a*b=c$, for example when at least one of the factors a, b is zero, i.e. a=0 and/or b=0.

By way of example, the factor a (corresponding to the first input variable E1) can have the value zero if the resistance of the first memristive function element MR-1 is programmed to such a high value that a time profile of the gate-source voltage during the application 202, 302, i.e. during charging of the capacitance C-1a (FIG. 2), does not reach a corresponding threshold value within a measurement period, i.e., for example before the end of a relevant measurement.

By way of example, the factor b (corresponding to the second input variable E2) can have the value zero if the input voltage V-1 has the value zero. In that case there is no charging of the capacitance C-1a, and the relevant FET becomes (for example, not at all) conductive, and will thus also not provide a current contribution during a measurement.

Further exemplary embodiments, FIG. 2, relate to a device 1000 for executing the method according to the embodiments.

In further exemplary embodiments, it is provided that the device 1000 has a processing device 100, 100a having at least a first transistor 110-1, for example a field-effect transistor, wherein, for example, the processing device 100, 100a has n many, n>1, transistors, for example field-effect transistors.

In further exemplary embodiments, FIG. 2, it is provided that the device has at least one charging device 12 for providing a charging current for the at least one transistor 110-1.

In further exemplary embodiments, FIG. 2, it is provided that the device 1000 has at least one measuring device 20, for example a current-based analog/digital converter, for ascertaining at least one of the following variables: a) first variable G1; b) second variable G2.

If the first and/or second variable is present in the form of an electrical voltage U-I-LS, for example the measuring device 20 can also be designed as an analog/digital converter for converting the electrical voltage U-I-LS into a digital (time- and/or value-discrete) signal.

In further exemplary embodiments, FIG. 2, it is provided that the device 1000 comprises a control device 400 which is designed to execute at least one of the following elements: a) control of at least one component (for example, 12 and/or 20) of the device 1000; b) execution of at least one aspect of the method according to the embodiments.

Figure 19:
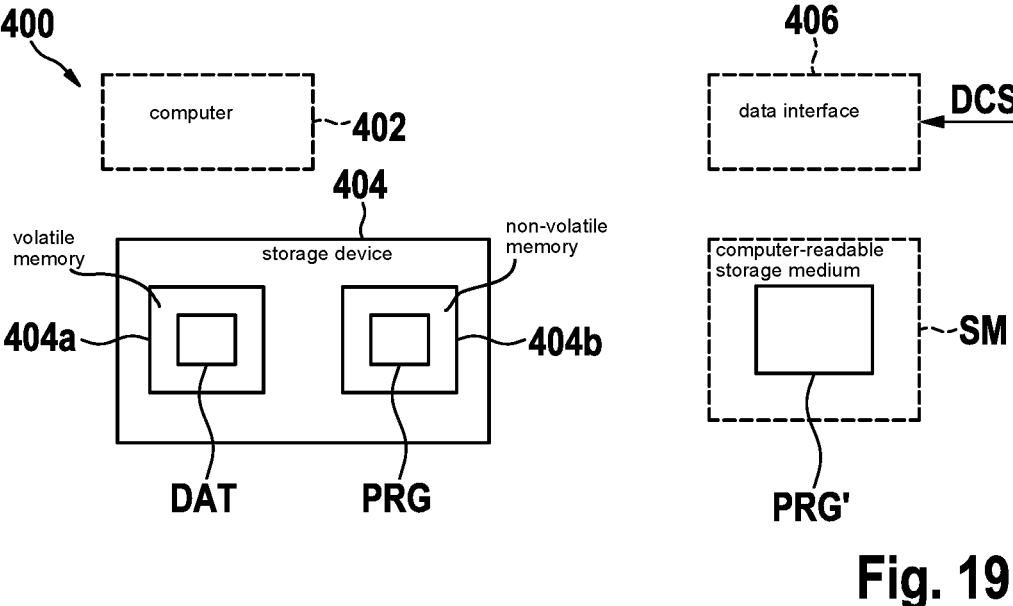
FIG. 19 schematically shows a simplified block diagram according to further exemplary embodiments of the present invention.

FIG. 19 shows by way of example a configuration of the control device 400 according to further exemplary embodiments.

By way of example, the control device 400 comprises: a computing device ("computer") 402 having at least one computing core (not shown); a storage device 404 associated with the computing device 402 for at least temporarily storing at least one of the following elements: a) data DAT (for example, data associated with at least one component of the device 1000 or of the processing device 100, for example, possible values for the first input variable E1 and/or possible values for the second input variable E2 and/or an assignment ASSIGN, and/or data relating to the current configuration (for example, characterizing how the memristive elements MR-1, MR-2, MR-3 are currently programmed and/or which values are currently being provided for the input voltages V-1, V-2, . . . ); b) computer program PRG, for example for carrying out the method according to the embodiments.

In further exemplary embodiments, the storage device 404 has a volatile memory (for example, working memory (RAM)) 404*a*, and/or a non-volatile memory (NVM) (for example, flash EEPROM) 404*b*, or a combination thereof or with other memory types not explicitly mentioned.

Alternatively, the control device 400 can also be designed, for example, as an ASIC (application-specific integrated circuit) and/or as a programmable logic circuit, for example FPGA, and/or as a microcontroller and/or as a digital signal processor and/or as an accelerator circuit, for example for matrix calculation operations, and/or as, for example, a pure hardware circuit, for example a digital circuit, and/or have at least one of these elements.

Further exemplary embodiments, FIG. 19, relate to a computer-readable storage medium SM comprising commands PRG' that, when executed by a computer 402, cause said computer to execute the method according to the embodiments.

Further preferred embodiments relate to a computer program PRG comprising commands that, when the program PRG is executed by a computer 402, cause said computer to execute the method according to the embodiments.

Further exemplary embodiments relate to a data carrier signal DCS that characterizes and/or transmits the computer program PRG according to the embodiments. For example, the data carrier signal DCS can be received via an optional data interface 406 of the device 400.

Figure 20:
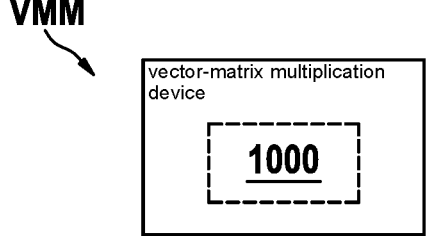
FIG. 20 schematically shows a simplified block diagram according to exemplary embodiments of the present invention.

Further exemplary embodiments, FIG. 20, relate to a computing device, for example a vector-matrix multiplication device VMM, comprising at least one device 1000 according to the embodiments.

Figure 21:
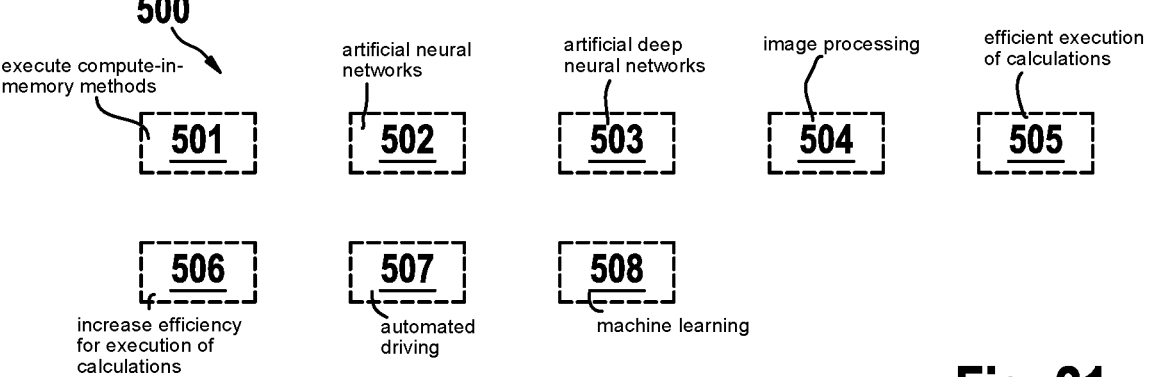
FIG. 21 schematically shows aspects of uses according to exemplary embodiments of the present invention.

Further exemplary embodiments, FIG. 21, relate to a use 500 of the method according to the embodiments and/or of the device 1000 according to the embodiments and/or of the computing device VMM according to the embodiments for at least one of the following elements: a) execution 501 of compute-in-memory methods, for example with weights and/or input variables E1, E2, which can, for example, in each case have a plurality of bits; b) artificial neural networks 502, for example artificial deep neural networks 503; c) image processing 504; d) efficient execution 505 of calculations; e) increasing 506 an efficiency for the execution of calculations; f) automated driving 507; g) machine learning 508, for example inference.

Sponsorship and Support Information

The project that has led to this application was sponsored by the joint venture ECSEL (JU) within the framework of sponsorship agreement no. 826655. The JU is supported by the research and innovation program Horizon 2020 of the European Union and Belgium, France, Germany, the Netherlands, Switzerland.

The invention claimed is:

1. A method for processing input variables using a processing device having at least a first transistor, comprising:
providing the first transistor, and a first memristive element which characterizes a first input variable associated with the first transistor, wherein a charging current of a capacitance associated with a control electrode of the first transistor can be influenced using the first memristive element;
applying to the control electrode of the first transistor a first control variable which characterizes a second input variable associated with the first transistor; and
ascertaining a first output variable which characterizes at least one product of the first input variable and of the second input variable, based on a first variable characterizing a time profile of a current through a load path of the first transistor.

2. The method according to claim 1, wherein the first variable is at least one of the following elements: a) the current through the load path itself; b) a voltage which can be ascertained based on at least the current through the load path.

3. The method according to claim 1, further comprising at least one of the following steps: a) using an intrinsic and/or parasitic capacitance of the first transistor, as the capacitance associated with the control electrode of the first transistor; b) providing an external capacitance for the capacitance associated with the control electrode of the first transistor.

4. The method according to claim 1, further comprising:
switching the first memristive element in series with the control electrode of the first transistor;
applying the first control variable to the control electrode of the first transistor via the first memristive element.

5. The method according to claim 1, further comprising:
switching the first memristive element in series with a load path of the first transistor; and
applying the first control variable to the control electrode of the first transistor.

6. The method according to claim 1, further comprising:
providing a charging current for charging the capacitance associated with the control electrode of the first transistor.

7. The method according to claim 1, further comprising:
providing an input voltage based on the second input variable;
applying the input voltage to the control electrode of the first transistor; and
at least periodically charging the capacitance associated with the control electrode of the first transistor.

8. The method according to claim 1, further comprising:
ascertaining a first point in time at which the current through the load path of the first transistor exceeds a prespecifiable first threshold value; and
ascertaining the first output variable based on the first point in time.

9. The method according to claim 8, wherein the prespecifiable first threshold value corresponds to at least one of the following elements: a) saturation current of the first transistor; b) a limit current to which the current through the load path of the first transistor can be limited and/or is limited; c) any prespecifiable current value.

10. The method according to claim 1, further comprising:
ascertaining a first time difference between a start of the application of the first control variable to the control electrode of the first transistor and a first point in time at which the current through the load path of the first transistor exceeds the prespecifiable first threshold value; and ascertaining the first output variable based on the first time difference.

11. The method according to claim 1, further comprising:

limiting the current through the load path of the first transistor using at least one limiting resistor connected in series with the load path.

12. The method according to claim 1, wherein the processing device includes at least one further transistor, wherein a corresponding first terminal of a load path of the first transistor and of the at least one further transistor is connected to a first circuit node, and wherein the method further comprises:

providing the at least one further transistor, and a corresponding further memristive element which characterizes a first input variable associated with the at least one further transistor, wherein a charging current of a capacitance associated with a control electrode of the at least one further transistor can be influenced using the corresponding further memristive element;

applying to a corresponding control electrode of the at least one further transistor a corresponding first control variable which characterizes a corresponding second input variable associated with the corresponding further transistor; and ascertaining the first output variable, which characterizes a sum of respective products of the corresponding first input variable and of the corresponding second input variable, based on a second variable characterizing a time profile of a current associated with the first circuit node, wherein the second variable is at least one of the following elements: a) the current associated with the first circuit node; b) a voltage that can be ascertained based on at least the current associated with the first circuit node.

13. The method according to claim 12, further comprising:

starting the application of the first control variable to the control electrode of the first transistor at a starting point in time; and repeatedly ascertaining the second variable during a prespecifiable time period from the starting point in time.

14. The method according to claim 12, further comprising:

ascertaining changes of the second variable at prespecifiable times, wherein the prespecifiable points in time are each associated with possible values for the corresponding first input variable and/or for the corresponding second input variable; and weighting the ascertained changes of the second variable, wherein weighted changes are obtained, and ascertaining the first output variable by summing the weighted changes of the second variable.

15. The method according to claim 14, further comprising:

repeating the ascertainment and weighting until a prespecifiable abort criterion is met.

16. The method according to claim 14, further comprising:

assigning the prespecifiable points in time to possible values for the corresponding first input variable and/or for the corresponding second input variable.

17. The method according to claim 1, wherein the method is used for at least one of the following elements: a) execution of compute-in-memory methods; b) artificial neural networks; c) image processing; d) efficient execution of calculations; e) increasing an efficiency for the execution of calculations; f) automated driving; g) machine learning.

18. A device for processing input variables, the device configured to:

i) provide a first transistor, and a first memristive element which characterizes a first input variable associated with the first transistor, wherein a charging current of a capacitance associated with a control electrode of the first transistor can be influenced using the first memristive element;

ii) apply to the control electrode of the first transistor a first control variable which characterizes a second input variable associated with the first transistor; and iii) ascertain a first output variable which characterizes at least one product of the first input variable and of the second input variable, based on a first variable characterizing a time profile of a current through a load path of the first transistor.

19. The device according to claim 18, wherein the device includes a processing device having the first transistor.

20. The device according to claim 18, further comprising at least one charging device for providing charging current for the first transistor.

21. The device according to claim 18, further comprising at least one measuring device for ascertaining at least one of the following variables: a) the first variable b) a second variable.

22. The device according to claim 18, further comprising a control device which is configured to execute at least one of the following elements: a) control of at least one component of the device; b) execution of at least one of i), ii), and iii).

23. A vector matrix multiplication device, comprising:

at least one device for processing input variables, each of the at least one device configured to:

i) provide a first transistor, and a first memristive element which characterizes a first input variable associated with the first transistor, wherein a charging current of a capacitance associated with a control electrode of the first transistor can be influenced using the first memristive element;

ii) apply to the control electrode of the first transistor a first control variable which characterizes a second input variable associated with the first transistor; and iii) ascertain a first output variable which characterizes at least one product of the first input variable and of the second input variable, based on a first variable characterizing a time profile of a current through a load path of the first transistor.

* * * * *